United States Patent [19]

Ziegelbein et al.

[11] 4,270,117
[45] May 26, 1981

[54] VARIABLE RATE DIGITAL CONTROLLER FOR A FREQUENCY SYNTHESIZER

[75] Inventors: Paul J. Ziegelbein, Cedar Rapids; Sylvan L. Dawson, Marion; Gerald A. Erickson, Cedar Rapids, all of Iowa

[73] Assignee: Rockwell International Corporation, El Segundo, Calif.

[21] Appl. No.: 8,897

[22] Filed: Feb. 2, 1979

[51] Int. Cl.³ .......................................... G01R 23/10
[52] U.S. Cl. .......................... 340/168 B; 235/92 EV; 455/185
[58] Field of Search ........ 340/168 R, 168 B, 168 CC, 340/167 R; 235/92 EV, 92 FQ; 328/44; 455/185, 187

[56] References Cited

U.S. PATENT DOCUMENTS

| | | | |
|---|---|---|---|
| 2,656,106 | 10/1953 | Stabler | 340/168 R |
| 3,023,373 | 2/1962 | Naylor | 235/92 EV |
| 3,518,586 | 6/1970 | Nilssen et al. | 455/185 |
| 3,573,734 | 4/1971 | Williams | 340/168 R |
| 3,651,469 | 3/1972 | Keese | 340/168 R |
| 3,665,323 | 5/1972 | Peterson | 328/14 |

FOREIGN PATENT DOCUMENTS 977780  3/1970  Fed. Rep. of Germany.

Primary Examiner—Alvin H. Waring
Attorney, Agent, or Firm—Howard R. Greenberg; H. Fredrick Hamann

[57] ABSTRACT

Variable rate digital control of a frequency synthesizer is afforded by periodically generating a digital signal from among a plurality of such digital signals representative of various tuning rates, converting each digital signal to a digital control word through a rate decoding means in which each control word is associated with at least one of the digital signals, applying the control words to a digital counting means having a plurality of counting rates, with each rate being determined by a different one of the control words, and applying the digital count of the digital counting means to the frequency synthesizer to control its frequency.

13 Claims, 2 Drawing Figures

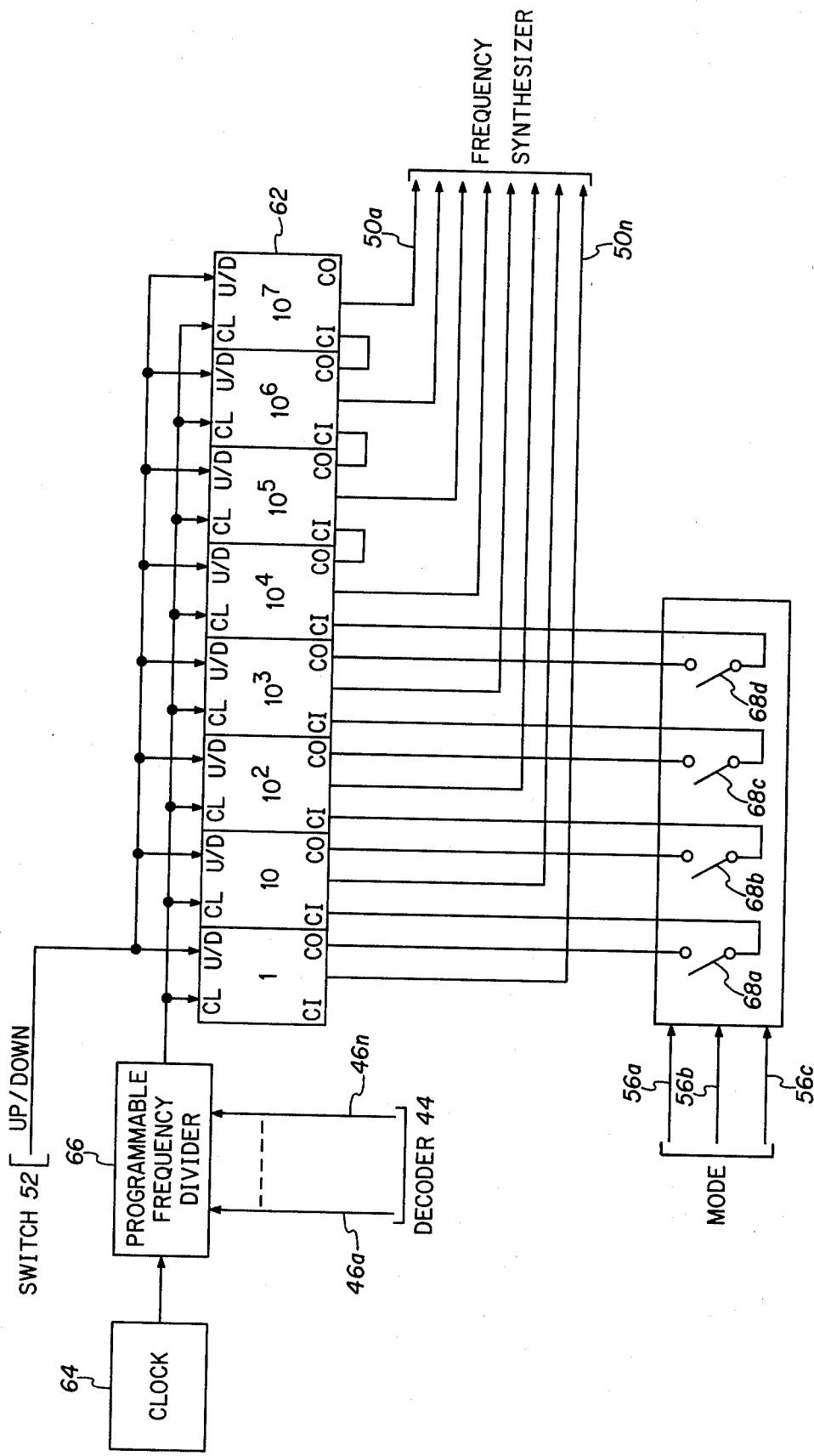

VARIABLE RATE DIGITAL CONTROLLER FOR A FREQUENCY SYNTHESIZER

BACKGROUND OF THE INVENTION

The invention herein pertains generally to receivers for receiving communications transmitted by way of a carrier signal having a prescribed frequency and specifically to such receivers which employ frequency synthesizers responsive to digital signals for providing the injection signals of appropriate frequency with which to demodulate the carrier.

Frequency synthesizers, which take advantage of digital electronic techniques, have widely supplanted the older types of analog A.C. signal sources for providing the injection signals required by radio receivers to demodulate the carrier signal over which communications are transmitted. In adapting this popular component to sweep-tune receivers, namely, receivers which permit facilely and conveniently tuning across a wide range of frequencies for possible transmissions over discrete frequencies within the frequency range, problems were encountered because of the conventional push button tuning control associated with frequency synthesizers vis-a-vis, the older mechanical rotary knob which could be rapidly rotated to change the value of reactive components which comprise the earlier injection signal sources to quickly vary the frequency smoothly and continuously when tuning. One solution to this problem, which was patented in U.S. Pat. No. 3,665,323, entitled "Proportional Digital Control For Radio Frequency Synthesizers" issued to Max Peterson and having the same assignee as the subject patent application, entails the use of a rotary knob for controlling a frequency synthesizer through the generation of a pair of pulse trains from an optical encoder whereby each rotation of the knob gives rise to a predetermined number of pulses to drive a digital counter whose digital output specifies the frequency of the frequency synthesizer. The relative phase of the trains is controlled by the direction of rotation of the knob for counting either up or down so as to either raise or lower the frequency, dependent on whether the knob rotation is clockwise or counterclockwise.

The foregoing arrangement is acceptable when the frequency synthesizer and tuning equipment, including the rotary knob tuning mechanism, are colocated or at least in close proximity to one another. However, when these are quite distant, as may often be the case where the economics preclude manning a sizeable number of sweep-tune monitor receivers, which one government may scatter over a wide region for intercepting messages of other foreign governments, the control of a receiver is effectuated remotely from a central manned location which may be hundreds or even thousands of miles distant, necessitating the use of communications media. These media, such as telephone lines, impose a constraint on the transmission rate of data so that it may not be possible for the digital counter associated with the frequency synthesizer to continuously and accurately receive and therefore track the data embodying the pulse train information at the control point, particularly if the rotary knob which gives rise to the pulses is being rapidly rotated. For example, when the pulses are converted to a conventional binary coded decimal format requiring four bits per individual digit specifying frequency, as taught in the previously mentioned Peterson patent, and the frequency specification extends from 1 hertz to 100 megahertz entailing eight frequency digits, the number of bits necessary to transmit the absolute frequency to which the frequency synthesizer is to be tuned is 32, not even considering the other required bits such as for timing, framing and parity check. Even if one were not to transmit the absolute frequency, but say the incremental frequency which might extend up to 10 kilohertz for rapid tuning, entailing five frequency digits, still 20 bits of information would be required for each frequency adjustment, ignoring the other requisite data bits. Transmitting the data over a communications link limited to 1200 bits/sec, as commonly found on voice grade telephone lines, would permit less than 60 frequency adjustments per second assuming 20 bits per adjustment. Compare this with the number of frequency adjustments possible by the operation of the rotary knob which typically produces 90 pulses and 90 corresponding frequency adjustments per knob rotation. At a rotation rate of three revolutions/second, which is not unreasonable, a human operator can produce 270 frequency changes per second. Were each frequency change to be encoded into a 20 bit digital word and transmitted over a 1200 bits/sec link, permitting only 60 frequency adjustments per second, some 210 discrete frequency changes could not be tracked and therefore monitored. Thus, whereas the direct application of pulses generated by the rotary knob to a digital counter as described in the aforementioned patent for local control results in acceptable operation, it is apparent that transmitting frequency data in an absolute or differential format over communication links results in lost data so that the frequency synthesizer to be controlled thereby does not properly track the remote control operation. This is unacceptable.

Another problem intrinsic to the sweep tuning digital technique described in the aforementioned patent is the linear relationship between the synthesizer tuning rate and the rotary knob operation. Since there are a fixed number of pulses generated for each knob revolution and the up/down counter for controlling the frequency synthesizer is merely clocked from these pulses, the counting rate which determines the speed with which the synthesizer is tuned is directly proportional to how fast the operator turns the rotary knob. Although, during the course of tuning the operator can select which frequency decade to change when traversing a particular frequency band, there is no flexibility within the chosen frequency band to tailor the synthesizer tuning rate to the rotary knob rotational speed, for example in exponential fashion, so as to enhance the facility with which an operator can traverse a wide range of frequencies.

In devising a scheme for translating the movement of a manually operated tuning mechanism, such as a rotary knob, into digital signals for controlling a frequency synthesizer, it is important and in some cases even essential that the scheme engender processor compatibility since many monitor receivers are offered with processor control systems. When in a processor control mode, the digital signals for controlling the frequency synthesizer are derived not from the tuning mechanism but rather from the digital output signal from the processor in accordance with the programmed control.

With the foregoing in mind, it is a primary object of the present invention to provide a new and improved means for digitally sweep-tuning a frequency synthesizer.

It is a further object of the present invention to provide such a new and improved means that engenders a minimal amount of data so as to lend itself to transmission over communication paths having data rate constraints.

It is still a further object of the present invention to provide such a new and improved means which affords programmability for tailoring different tuning rates to different control rates.

It is still a further object of the present invention to provide such a new and improved means that is compatible with both manual and processor controls.

The foregoing objects, as well as others, and the means by which they are achieved through the present invention, may best be appreciated by referring to the Detailed Description of the Preferred Embodiment which follows together with the appended drawings.

BRIEF DESCRIPTION OF THE INVENTION

In accordance with the foregoing objects, the present invention affords a variable rate digital controller for a frequency synthesizer whose frequency is determined by digital signals applied thereto under the control of either a manually operated tuning mechanism, such as a rotary knob, or the digital output signals from a processor which periodically generates a digital signal from among a plurality of such digital signals representative of various tuning rates. Each digital signal is converted to a digital control word through a rate decoding means in which each control word is associated with at least one of the digital signals. The control words are then applied to a digital counting means having a plurality of counting rates, with each rate being determined by a different one of the control words. The digital count of the counting means is applied to the frequency synthesizer to control its frequency. When the synthesizer control is effected through a manually operated tuning mechanism, the rate indicating digital signals are provided by generating a pulse train whose pulse frequency is proportional to the movement of the mechanical tuning mechanism and periodically sampling the pulse frequency of the train and converting it to one of the digital signals. It is to be noted that since the rate decoding means allows different digital control signals to be associated with the various digital signal indications of pulse frequency and consequently movement of the mechanical tuning mechanism, such as rotational speed of the rotary knob, any desired tuning pattern may be afforded, for example exponentially increasing the synthesizer tuning rate as the mechanical tuning mechanism speed linearly increases. This permits the sweep tuning over a wide frequency range that is tailored to the convenience of the user.

When the frequency synthesizer is to be remote controlled so as to require transmission of the control information over some communications link, the digital signals representative of pulse train frequency are incorporated into digital bytes suitable for transmission via a carrier signal. By limiting the number of recognizable discrete pulse train frequencies, the number of bits required for effective tuning control may be minimized so as to afford a data rate that is well within the capability of the communications medium. In the preferred embodiment, 32 different rates, including zero, are defined, entailing the specification of only five data bits in a binary coded digital byte in contradistinction to the much greater number of bits that would be required to specify the information through absolute or differential frequency adjustment. The successful transmission and reception of all data information for controlling the frequency synthesizer ensures that its tuning properly tracks that of the operator control so that no desired monitored frequencies are inadvertently passed over.

BRIEF DESCRIPTION OF THE DRAWINGS

FIG. 2 is a detailed drawing of the digital counting means of FIG. 1 which affords the variable tuning rates.

DETAILED DESCRIPTION OF THE PREFERRED EMBODIMENT

Figure 1:
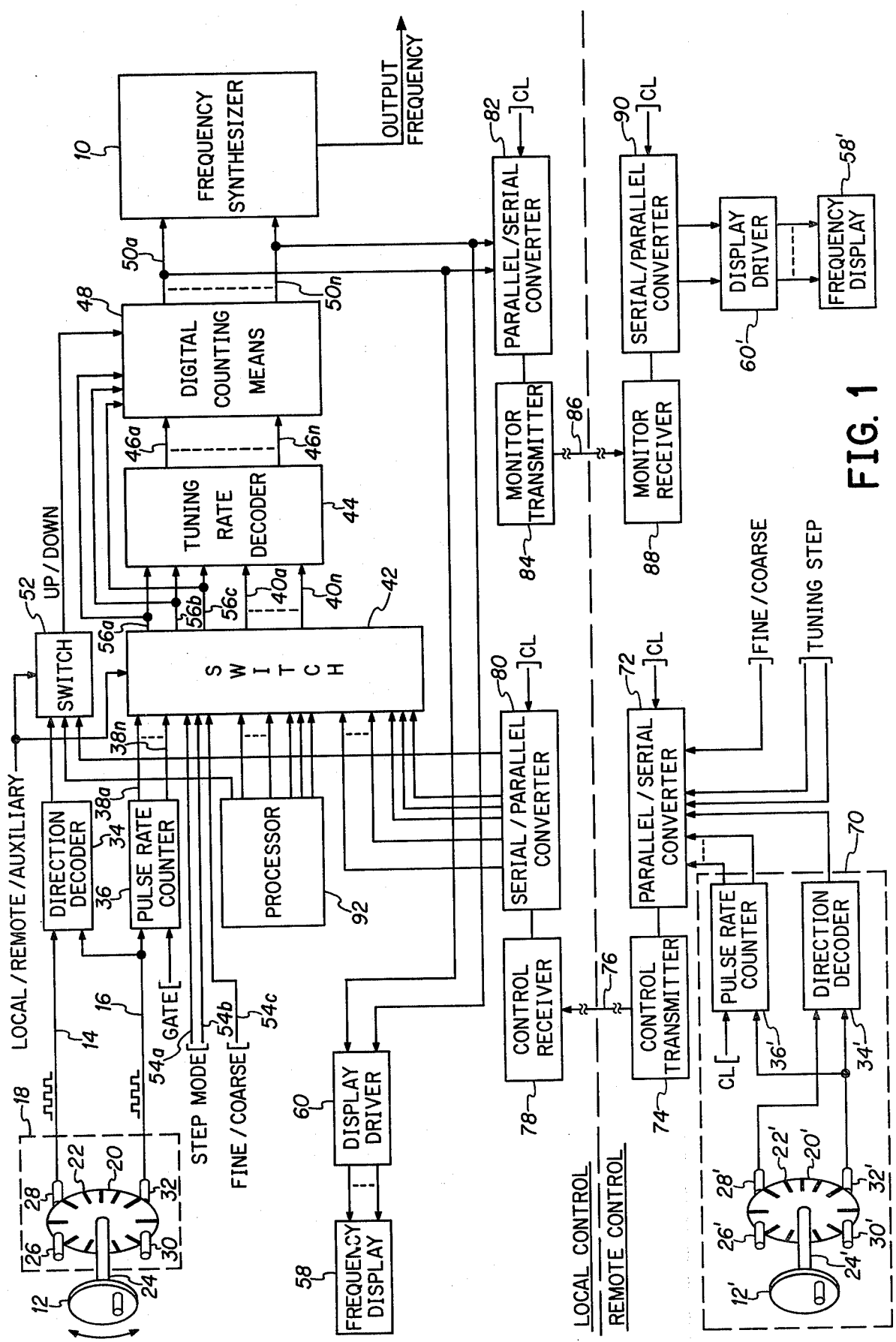
FIG. 1 is a block diagram depicting the variable rate digital controller of the invention for controlling the tuning of a frequency synthesizer.

As shown in FIG. 1, a frequency synthesizer 10 which comprises a receiver such as an HF radio receiver (not shown) for providing the injection frequencies necessary to demodulate a carrier signal received by the radio, may have its frequency tuned by the operation of a manually operated tuning mechanism, such as rotary knob 12. Rotary knob 12 normally would be physically located on the front panel of the control section of the radio which in FIG. 1 is assumed to be colocated with all of the radio equipment and is thus designated local. As rotary knob 12 is rotated, the frequency output of frequency synthesizer 10 is changed to either increase or decrease in value dependent upon the direction of knob rotation. This operational control is effectuated through a pair of pulse trains generated on leads 14 and 16 through an optical encoder 18 which is described in detail in the earlier mentioned Peterson U.S. patent. As delineated therein, a transparent disc 20 having opaque slots 22 around its periphery rotates in concert with rotary knob 12 by virtue of shaft 24 linking the two to intermittently break the light beams passing between light emitting diode 26 and phototransistor 28 and light emitting diode 30 and phototransistor 32, respectively. Each light passage interruption resulting from an opaque slot 22 passing between a light emitting diode 26 or 30 and its associated phototransistor 28 or 32, respectively, gives rise to a pulse on the associated output lead 14 or 16, respectively, with the number of pulses per revolution of the knob 12 being fixed and equal to the number of slots 22 (ninety in the preferred embodiment) around the periphery of transparent disc 20. Moreover, the relative placement of the two light beams passing through disc 20 results in the pulse train on lead 14 leading the pulse train on lead 16 when the rotary knob 12 is turned in one direction and lagging it when the knob 12 is rotated in the opposite direction. The number of pulses generated on either lead 14 or 16 is representative of the number of revolutions of the rotary knob 12 which controls the desired frequency change and the relative phasing of the two pulse trains defines the direction of the knob rotation for determining the direction of frequency change, whether up or down.

Both pulse trains on leads 14 and 16 are applied to a direction decoder 34 which compares their phase to produce a bilevel output signal indicative of the direction of frequency change, for example, a high level constituting an increase in frequency and a low level a decrease. The pulse train on lead 16 is applied to a pulse rate counter 36 as well which is allowed to periodically sample the pulse train frequency through a gating pulse applied thereto. During the gating period, which typically might be 100 milliseconds, the pulse rate counter 36 counts the number of pulses received on lead 16 and provides a digital signal indication thereof on its output leads 38a-38n. Where a five stage counter is used for pulse rate counter 36, the five output leads 38 associated therewith permit identifying 32 different pulse frequencies, including zero (knob 12 stationary), using pure binary coding. At the end of the counting cycle coincident with the termination of the gating pulse, the pulse rate counter 36 is reset to zero and a new counting cycle initiated.

The output leads 38 of pulse rate counter 36 may be interconnected with corresponding leads 40a-40n via a switch 42 dependent upon the status of a local/remote/auxiliary control signal applied thereto. When local control of the frequency synthesizer 10 is desired a switch on the radio control panel causes one signal corresponding to local control to be applied to switch 42 so as to interconnect leads 38 with leads 40. As will be addressed later on, leads 40 can also be interconnected with other leads to effectuate remote control operation when the local/remote/auxiliary signal corresponds to remote or processor control when the signal corresponds to auxiliary.

Leads 40a-40n are connected to a rate decoder 44 (which can be either any conventional logic circuit decoder or a programmable read only PROM) having output leads 46a-46n on which digital control words are generated. Leads 46 are connected to a digital counting means 48 which has variable counting rates, with the counting rate dependent on the digital control word applied thereto via leads 46. The count of digital counting means 48 at all times appears on its output leads 50a-50n which are connected to frequency synthesizer 10. Since the frequency to which the synthesizer 10 is tuned is a function of the digital count applied thereto via leads 50, which is in turn changing at a rate determined by the digital control word applied to digital counting means 48 via leads 46, the tuning rate of synthesizer 10 is dependent on how rate decoder 44 is arranged or programmed. The direction of frequency change follows the counting direction for digital counting means 48 increasing as it counts up and decreasing as it counts down under the control of the bilevel up/down signal applied thereto from the output of direction decoder 34 via a switch 52 when the local/remote/auxiliary signal applied thereto corresponds to local control.

Each digital signal representative of a different pulse frequency applied to decoder 44 via leads 40 gives rise to a particular digital control word for controlling the frequency synthesizer 10 tuning rate via digital counting means 48 to achieve any desired tuning pattern. Thus, assuming a PROM was used, each digital signal would correspond to an address location for decoder 44 in which is stored the desired digital control word for establishing the counting and consequently synthesizer tuning rate corresponding to the tuning control rate designated by the digital signal. A digital signal of zero indicating the absence of tuning as manifested, for example, by a stationary condition for knob 12, would produce an equivalent digital control word for zero rendering digital counting means 48 inoperative so that the frequency synthesizer 10 remains tuned to the last frequency it achieved when knob 12 stopped rotating as designated by the digital count output of counting means 48. At all other times frequency synthesizer 10 is continuously and smoothly tuned by virtue of the continuous operation of digital counting means 48 since a digital control word is always present on the leads 46 thereto. This digital control word assumes a new value, if any, in response to a changed digital signal at the output of counter 36 at the end of each gating pulse applied to counter 36.

It will be noted that additional tuning flexibility is afforded by virtue of two leads 54a and 54b, identified as step mode, that are connected to both decoder 44 and digital counting means 48 via switch 42. When switch 42 is in the local control position by virtue of the local/remote/auxiliary signal applied thereto, leads 54a and 54b are interconnected with leads 56a and 56b, respectively, which carry two bits of information regarding step counting mode that can be derived either from the control panel itself or through strapping options, as desired. Leads 56a and 56b are employed to designate the type of frequency step change desired in synthesizer 10 in response to unit count changes in counting means 48, e.g. increments of 1, 10 or 100 hertz. With two bits of information available on the two leads 56a and 56b, of course, a fourth step change could be specified if desired. Lead 56c, which interconnects lead 54c, designated fine/coarse, with decoder 44 and counting means 48, is employed to designate whether fine or coarse tuning is desired to allow a human operator to quickly tune the synthesizer 10 to the frequency range desired to be swept. When in the fine mode the specified step mode count is implemented and when in the coarse mode some minimum higher step count such as 100 kilohertz is invoked to override the normal step mode count for rapidly changing the frequency of synthesizer 10. By applying the step and fine/coarse counting modes to the decoder 44 via leads 54 and 56 different digital words and corresponding tuning rates can be associated with the same pulse frequency and rotational speed of knob 12 for different counting modes. This affords greater flexibility for tailoring the tuning profile of the synthesizer to individual needs.

To apprise the operator of the frequency to which the synthesizer 10 is tuned, the output leads 50 of digital counting means 48 are applied to a visual frequency display 58 via a display driver 60 which converts the digital count format of counting means 48 to the appropriate format for controlling the display 58. In this connection, it should be mentioned that the count formed for counting means 48 is preferably BCD and that each of the output leads 50 corresponds to four wires for specifying an individual digit of the count and consequently frequency. Each digit is conventionally displayed through the use of seven bars requiring seven inputs and display driver 60 accordingly would be a BCD to seven bar decoder.

Before proceeding to a discussion of the invention in connection with the remote and processor control modes, the reader's attention is directed to FIG. 2 which depicts the digital counting means 48 in detail. As will be observed, the digital counting means 48 in the preferred embodiment comprises an eight stage digital BCD counter 62 for affording an eight decade frequency control extending from one hertz through 10 megahertz. As with FIG. 1, each output lead 50 to the frequency synthesizer 10, originating from a different stage of the digital counter 62, represents four wires for specifying the associated digit in binary coded decimal form. The bilevel up/down signal from switch 52 for controlling counting direction is applied in parallel to all of the up/down inputs U/D of the individual stages of digital counter 62 while the clock pulses are likewise applied in parallel to their clock inputs CL. The clock pulses are derived from a clock 64 via a conventional programmable frequency divider 66 which affords different frequency division ratios to provide different clock frequencies at its output for driving digital counter 62. The clock frequency appearing at the output of frequency divider 66 is dependent on the digital control word applied thereto from decoder 44 via leads 46a–46n.

In conventional fashion, the carry-in lead CI of the three stages of digital counter 62 corresponding to the three highest frequency digits, namely, 100 kilohertz-10 megahertz is directly connected to the carry-out lead CO of the next lower stage in the counting chain. Thus, as each one of the $10^4$–$10^6$ stages transits a full decode count, it allows the next succeeding stage to transit a unit count. EAch of the CO leads of the four lowest order stages of counter 62, namely those corresponding to 1 hertz through 1 kilohertz is connected to the CI lead of the next higher stage through an individual switch, switches 68a–68d being respectively associated therewith. These electronic switches, pictured symbolically in FIG. 2, are under the control of the step and fine/coarse mode signals applied thereto via leads 56(a–c). When a switch 68 is closed, the stage of digital counter 62 whose CI lead to which it is connected is enabled to count in a normal fashion so as to change its count by one each time that the next lower order stage transits a full decode count. When the switch 68 is opened, however, that particular stage responds to each clock pulse to change its count accordingly. Thus, when in a coarse counting mode as determined by the signal on lead 56c, switch 68d is rendered open so that the stage of digital counter 62 corresponding to ten kilohertz changes count by one with each clock pulse irrespective of the count changes in the lower order counting stages. In the fine mode (switch 68d closed), the step count desired is designated by the signals on leads 56a and 56b for controlling switches 68a–68c. Accordingly, if a one hertz counting mode were desired all three switches 68a–68c would be closed. If a 10 hertz counting step mode were desired, then switch 68a would be opened and similarly, if a 100 hertz counting step mode were desired switch 68b would likewise be opened together with switch 68a. With all three switches 68a–68c opened, the step counting mode would correspond to 1 kilohertz. It should be remembered, that whichever counting mode the frequency synthesizer may be in, the actual counting rate for varying the frequency is determined by the clock frequency at the output of the frequency divider 66 under the control of the digital control words appearing at the output leads 46 of decoder 44.

Turning now to the remote control mode of the invention, it will be seen from FIG. 1 that the equipment physically separated from the receiver, designated Remote Control, which controls its operation includes the same combination 70 of elements for providing the dual pulse trains and generating therefrom the same digital signals as found in the local control equipment previously described, and as such the elements bear the same reference numerals modified with a superscript prime designation. The output of pulse rate counter 36' and direction decoder 34' along with the step and fine/coarse counting mode signals are entered into a parallel/serial converter 72 where under the control of a suitable clock the parallel entered bits together with other necessary bits such as for framing and synchronization are outputted as a serial pulse stream to modulate a carrier signal in control transmitter 74 for transmission over any desired medium represented symbolically by transmission channel 76. Upon receipt by a control receiver 78 at the radio receiver local control site, the carrier signal is demodulated and the serial bit stream applied to a serial/parallel converter 80 whose parallel output leads are connected to switches 42 and 52 so that the signals thereon can be applied to the decoder 44 and digital counting means 48 when the local/remote/auxiliary signal corresponds to the remote mode. Since frequency control is effectuated by transmitting only pulse frequency information amounting to only five bits in the preferred embodiment, and not absolute or differential frequency information which would amount to 20 and 32 bits respectively in the preferred embodiment, it is readily apparent that data rate constraints posed by the communications medium are not as serious an impediment to tracking of the frequency synthesizer tuning to the remote control operation.

To afford the remote control operator information as to which frequency the synthesizer 10 is tuned to, the output leads 50 of digital counting means 48 are connected to a parallel/serial converter 82 at the local site to generate a serial bit stream which is then modulated onto a carrier via a monitor transmitter 84 and transmitted over another communications channel 86 to a monitor receiver 88 located at the remote control site. After the carrier signal is demodulated, the serial bit stream is passed through a serial/parallel converter 90 whose parallel output bits are applied to a frequency display 58' via display driver 60'. Unlike the control data communications which engenders tuning rate information rather than frequency information, the monitor data communications must embody frequency information and consequently the greater number of bits associated therewith. The inability of the monitor data to closely track the tuning function however is not as harmful as the inability of the tuning function to track the operator control thereof since this merely results in the human operator not knowing the exact frequency of the synthesizer while tuning. However, once tuning is ceased by the operator in response to the reception of an audible signal over some discrete frequency, that frequency would be properly displayed.

Many sweep-tune receivers are designed to respond to processor control as well as supervisory control by a human operator. Thus for maximum customer appeal, it is highly desirable to make this option available. It will be readily seen from FIG. 1 that the subject invention conveniently and facilely accomplishes this by simply applying the normal digitally formatted output signals (like those of pulse rate counter 36) from a processor 92 to decoder 44 and digital counting means via switches 42 and 52 by interconnecting corresponding leads upon command to do so through the local/remote/auxiliary signal corresponding to auxiliary mode. Although the bits at the output of processor 92 are shown in parallel, they can be serialized in which case they would then be merely passed through a serial/parallel converter. Also, although the processor is shown colocated with synthesizer 10, it could be remotely located and the bits transmitted thereto as in the remote control configuration.

As the foregoing demonstrates, the subject invention affords a variable rate digital controller for use with a frequency synthesizer which permits great tuning flexibility whether the control is local, remote or by way of processor. Since modifications to the preferred embodiment may be made by those skilled in the art without departing from the scope and spirit of the invention, the foregoing detailed description is intended to be merely exemplary and not circumscriptive of the invention as it will now be claimed hereinbelow.

What is claimed is:

1. A variable rate digital controller for a frequency synthesizer which is responsive to digital signals for controlling its frequency, comprising:

rate indicating means for periodically generating a digital signal from among a plurality of such digital signals representative of various tuning rates;

rate decoding means for receiving the digital signals and providing in response thereto digital control words, with each word being associated with at least one of the digital signals;

digital counting means having a plurality of counting rates, with each rate being determined by a different one of the control words applied thereto, and means for applying the digital count of said digital counting means to the frequency synthesizer to control its frequency.

2. The digital controller of claim 1 wherein the frequency of the frequency synthesizer is controlled by the movement of a manually operated tuning mechanism and said rate indicating means includes means for generating a pulse train whose pulse frequency is proportional to the rate of movement of the tuning mechanism and pulse counting means for periodically sampling the pulse frequency of the train and converting it to one of the digital signals to be applied to said decoding means.

3. The digital controller of claim 1, including a second tuning mechanism for tuning the frequency synthesizer, remotely located therefrom, together with a second means for generating a second pulse train whose pulse frequency is proportional to the movement of the second tuning mechanism and a second pulse counting means for periodically sampling the pulse frequency of the train generated therefrom and providing a digital signal indicative thereof and means for transmitting the digital signal from said second pulse counting means to the frequency synthesizer site, and further including switching means for selecting which one of the digital signal outputs from the two pulse counting means is to be applied to said digital counting means.

4. The digital controller of claims 1, 2 or 3, wherein said digital counting means comprises a digital counter, a source of clock pulses and a programmable frequency divider for applying the clock pulses to said digital counter in response to the digital control words from said rate decoding means.

5. The digital controller of claim 3 further including display means located at the remote control site for displaying frequency information and means for transmitting the digital count of said digital counting means to the remote site for application to said display means.

6. The digital controller of claim 3 wherein the tuning mechanisms are rotary knobs and each of said pulse generating means generates two pulse trains having a like number of pulses that is fixed per associated knob revolution and a relative phase relationship dependent on the direction of the knob rotation.

7. A method for digitally controlling a frequency synthesizer whose frequency is determined by digital signals applied thereto, comprising:

periodicaly generating a digital signal from among a plurality of such digital signals representative of various tuning rates;

converting each digital signal to a digital control word with each control word being associated with at least one of the digital signals;

digitally counting at a rate determined by the control words, there being a different rate associated with each one of the control words, and applying the digital count to the synthesizer to control its frequency.

8. The method of claim 7 wherein the frequency synthesizer is controlled by the movement of a manually operated tuning mechanism and said generating means includes generating a pulse train whose pulse frequency is proportional to the rate of movement of the tuning mechanism and periodically sampling the pulse frequency of the train and converting it to one of the digital signals.

9. The method of claim 8 including generating a second pulse train whose pulse frequency is the same as that of the first pulse train and whose phase relative thereto controls the direction of digital counting and which is itself determined by the direction of movement of the tuning mechanism.

10. A variable rate digitally controlled frequency synthesizer, comprising:

a frequency synthesizer whose frequency is determined by digital signals applied thereto;

rate indicating means for periodically generating a digital signal from among a plurality of such digital signals representative of various tuning rates;

rate decoding means for receiving the digital signals and providing in response thereto digital control words, with each word being associated with at least one of the digital signals;

digital counting means having a plurality of counting rates, with each rate being determined by a different one of the control words applied thereto, and means for applying the digital count of said digital counting means to the frequency synthesizer to control its frequency.

11. The frequency synthesizer of claim 10 wherein its frequency is controlled by the movement of a manually operated tuning mechanism and said rate indicating means includes means for generating a pulse train whose pulse frequency is proportional to the rate of movement of the tuning mechanism and pulse counting means for periodically sampling the pulse frequency of the train and converting it to one of the digital signals to be applied to said decoding means.

12. The frequency synthesizer of claim 11 wherein said tuning mechanism is a rotary knob.

13. The frequency synthesizer of claims 11 or 12 wherein said digital counting means comprises a digital counter, a source of clock pulses and a programmable frequency divider for applying the clock pulses to said digital counter in response to the digital control words from said rate decoding means.

* * * * *